US012575029B2

(12) United States Patent
Takada et al.

(10) Patent No.: US 12,575,029 B2
(45) Date of Patent: Mar. 10, 2026

(54) WIRING BOARD

(71) Applicant: TOPPAN INC., Tokyo (JP)

(72) Inventors: Takeshi Takada, Tokyo (JP); Yuki Umemura, Tokyo (JP)

(73) Assignee: TOPPAN INC., Tokyo (JP)

( * ) Notice: Subject to any disclaimer, the term of this patent is extended or adjusted under 35 U.S.C. 154(b) by 352 days.

(21) Appl. No.: 18/127,295

(22) Filed: Mar. 28, 2023

(65) Prior Publication Data

US 2023/0240009 A1 Jul. 27, 2023

Related U.S. Application Data

(63) Continuation of application No. PCT/JP2021/034064, filed on Sep. 16, 2021.

(30) Foreign Application Priority Data

Sep. 28, 2020 (JP) ................................. 2020-161639

(51) Int. Cl.
H05K 3/00 (2006.01)
H05K 1/09 (2006.01)
(Continued)

(52) U.S. Cl.
CPC ................. H05K 1/09 (2013.01); H05K 3/42 (2013.01); H05K 3/46 (2013.01); H05K 2201/0137 (2013.01); H05K 2203/072 (2013.01)

(58) Field of Classification Search
CPC .............................. H05K 1/09; H05K 3/4605
See application file for complete search history.

(56) References Cited

U.S. PATENT DOCUMENTS 5,126,016 A * 6/1992 Glenning ................. H05K 3/07
205/125
2002/0140083 A1* 10/2002 Matsuda ................. H01L 24/49
257/711
(Continued)

FOREIGN PATENT DOCUMENTS

JP 2011-134957 A 7/2011
JP 2017-005205 A 1/2017
(Continued)

OTHER PUBLICATIONS

International Searching Authority, "International Search Report," issued in connection with International Patent Application No. PCT/JP2021/034064, dated Dec. 14, 2021.
(Continued)

*Primary Examiner* — Timothy J Thompson
*Assistant Examiner* — Aditya Sharma
(74) *Attorney, Agent, or Firm* — Foley & Lardner LLP

(57) ABSTRACT

A wiring board includes a first wiring layer disposed on the first adhesion layer; and a second wiring layer disposed on the second adhesion layer, wherein a proportion of copper remaining in the first wiring layer is represented by C=B/A (%), where A is a total area of the first wiring layer, B is an area of copper in the first wiring layer, and C is a remaining copper ratio C defined as the proportion of copper remaining in the first wiring layer, and wherein when the remaining copper ratio C is set to 70 to 100%, the first adhesion layer is comprised of at least one material having a first predetermined Young's modulus, and the first wiring layer is comprised of at least one material having a second predetermined Young's modulus, the first predetermined Young's modulus being 0.1 to 0.85 times the second predetermined Young's modulus.

4 Claims, 7 Drawing Sheets

(51) Int. Cl.
　　H05K 3/42　　　(2006.01)
　　H05K 3/46　　　(2006.01)

(56)　　　　　　References Cited

U.S. PATENT DOCUMENTS

| | | | |
|---|---|---|---|
| 2011/0067901 A1 | 3/2011 | Kim et al. | |
| 2016/0128186 A1* | 5/2016 | Cho ..................... | H05K 1/0271 |
| | | | 29/846 |
| 2017/0263545 A1 | 9/2017 | Tsukamoto et al. | |
| 2019/0306982 A1* | 10/2019 | Nagaoka ................ | H05K 3/027 |
| 2020/0275558 A1 | 8/2020 | Fujita | |
| 2021/0298172 A1 | 9/2021 | Onohara | |
| 2022/0085253 A1 | 3/2022 | Konishi | |

FOREIGN PATENT DOCUMENTS

| | | |
|---|---|---|
| WO | WO-2020/116228 A1 | 6/2020 |
| WO | WO-2020/137763 A1 | 7/2020 |

OTHER PUBLICATIONS

International Searching Authority, "Written Opinion," issued in connection with International Patent Application No. PCT/JP2021/034064, dated Dec. 14, 2021.

European Extended Search Report issued in corresponding European Patent Application No. 21872314.6 dated Feb. 21, 2024 (10 pages).

Office Action issued in corresponding Chinese Patent Application No. 202180065590.4 dated Apr. 24, 2025.

* cited by examiner

WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2021/034064, filed on Sep. 16, 2021, which in turn claims the benefit of JP 2020-161639, filed Sep. 28, 2020, the disclosures of all which are incorporated herein by reference in its entirety.

TECHNICAL FIELD

The present invention relates to wiring boards.

BACKGROUND ART

Wireless communication systems that enable the rapid spread of advanced mobile devices, such as smartphones, are supported by increasingly sophisticated radio frequency front-end modules (RFFMs). An RFFM is composed of a filter, a power amplifier (PA), a low-noise amplifier (LNA), and an RF switch. RFFMs tend to have more components as their circuits become more complicated with the increasing integration of components.

In particular, the number of components mounted on RFFMs increases as RFFMs are required to have a smaller size, a smaller thickness, more functions, and the like; in order to address this, there has been a growing demand for reduction in the thickness of packages for RFFMs. To achieve such reduction in the thickness of packages for RFFMs, employment of thin multilayer wiring boards is known.

Conventionally, a method of reducing the thickness of laminated resins in a thin multilayer wiring board is widely used to provide thin RFFMs.

As thin multilayer wiring boards on which electronic components such as semiconductor chips are to be mounted, those of various shapes and structures have been proposed. For example, as disclosed in PTL 1, thin multilayer wiring boards are known that include an intermediate wiring layer and an insulating layer disposed on each of upper and lower sides of the wiring layer such that the insulating layers have formed therein via wirings through which connection of the wiring layer is provided.

[Citation List] [Patent Literature] [PTL 1] JP 2011-134957 A.

SUMMARY OF THE INVENTION

Technical Problem

Thin multilayer wiring boards face the problem of how to ensure connection reliability thereof. In particular, thinner wiring boards have more pronounced warpage, which presents problems of low mounting yields, low reliability, and the like.

The present invention has been made in view of the above problems; an object of the present invention is to provide wiring boards that have suppressed warpage while being thin and thus have high connection reliability so as to be capable of adapting to reduction in thickness of, for example, advanced mobile devices.

Solution to Problem

In order to solve the above problems, a representative wiring board of the present invention includes:

a glass core member having:
a first major surface;
a second major surface opposite the first major surface; and
through holes penetrating the glass core member between the first major surface and the second major surface, each of the through holes having a first end adjacent the first major surface, a second end adjacent the second major surface, and a bottom portion at the second end;
a first adhesion layer in close contact with the first major surface and respective inner walls of the through holes, the first adhesion layer having portions each closing the bottom portion of a respective one of the through holes;
a second adhesion layer in close contact with the second major surface and the portions of the first adhesion layer;
a first wiring layer disposed on the first adhesion layer; and
a second wiring layer disposed on the second adhesion layer, wherein
a proportion of copper remaining in the first wiring layer is represented by C=B/A (%),
where
A is a total area of the first wiring layer,
B is an area of copper in the first wiring layer, and
C is a remaining copper ratio C defined as the proportion of copper remaining in the first wiring layer, and wherein
when the remaining copper ratio C is set to 70 to 100%, the first adhesion layer is comprised of at least one material having a first predetermined Young's modulus, and the first wiring layer is comprised of at least one material having a second predetermined Young's modulus, the first predetermined Young's modulus being 0.1 to 0.85 times the second predetermined Young's modulus.

Advantageous Effects of the Invention

The present invention provides wiring boards that have suppressed warpage while being thin and thus have high connection reliability so as to be capable of adapting to reduction in thickness of, for example, advanced mobile devices.

Problems, configurations, and effects other than those described above will be apparent from the description of the embodiments below.

DETAILED DESCRIPTION

Embodiments

Figure 1:
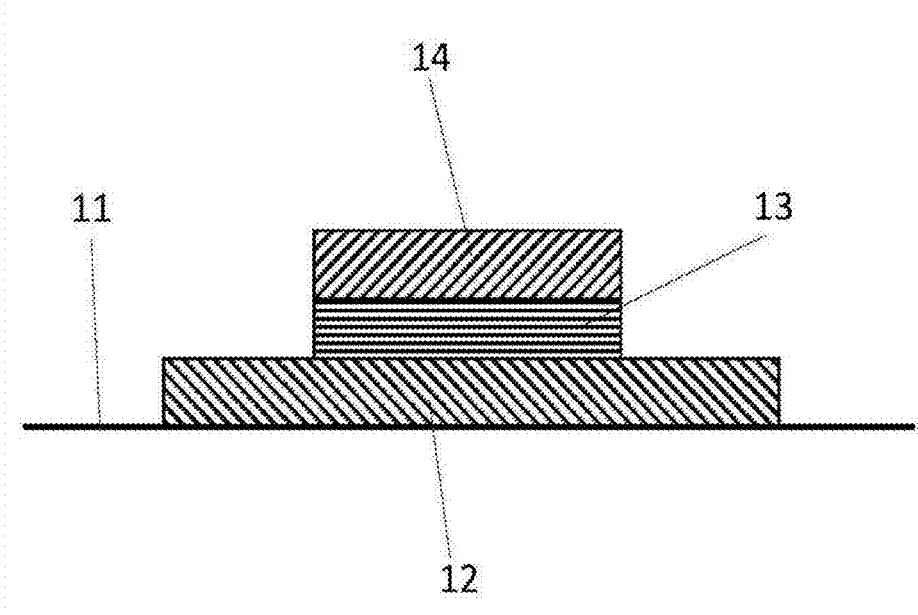
FIG. 1 is a cross-sectional view of a capacitor in an embodiment of the present invention.

An embodiment of the present invention will be described below with reference to the drawings. The embodiment described below merely presents examples of a device and a method for embodying the technical idea of the present invention. The technical idea of the present invention should not limit the materials, shapes, structures, layouts, and the like of the components to those described herein. The technical idea of the present invention can be variously modified within the technical scope defined in the claims.

The term "surface" as used herein refers to a major surface of a plate-shaped member or an interface between layers thereof that is substantially parallel to a major surface of the plate-shaped member. The terms "upper surface" and "lower surface" as used herein refer to surfaces shown on the upper side and the lower side of a drawing, respectively, in cases where a plate-shaped member or layers thereof are shown.

The term "lateral surface" refers to the side of a plate-shaped member or layers thereof, or to a thickness portion of these layers. Further, a portion constituted by part of the major surface and the lateral surface may be referred to as "edge".

The term "upper" refers to a vertically upward direction in cases where a plate-shaped member or layers thereof are horizontally disposed. Further, "upper" and "lower", which refer to opposite directions, may each be referred to as "z-axis direction"; and the horizontal direction may be referred to as "x-axis direction" or "y-axis direction".

The terms "plan view shape" and "plan view" refer to the shape of a surface or a layer as viewed from above. Further, the terms "cross-sectional shape" and "cross-sectional view" refer to the shape of a cross-section of a plate-shaped member or layers thereof taken along a particular direction and viewed in a horizontal direction.

The term "central portion" refers to a central portion of a surface or a layer, not a peripheral portion thereof. Further, the term "center direction" refers to a direction toward the center of a plan-view shape of a surface or a layer from the peripheral portion thereof.

The phrase "the amount of remaining wiring layer" refers to the volume obtained by multiplying the area of a pattern of a wiring layer by the thickness of the wiring layer as viewed perpendicular to the wiring board.

The term "circuit element" refers to a passive element such as a resistor, a capacitor, an inductor, or a reactor, and preferably refers to an element serving as a component of an LC circuit. Such circuit elements are preferably components of an LC filter that constitutes a bandpass filter used in Time Division Duplex (TDD) at frequency bands of at least 2 GHz or higher among multi-band communication systems. Such an LC filter may be a low-pass filter, a high-pass filter, a demultiplexing filter such as a diplexer, or a notch filter that removes noise in a specific frequency band.

In a wiring board of the present embodiment, an LC filter preferably constitutes a bandpass filter used in TDD at frequency bands of at least 2 GHz or higher among the multi-band communication systems. A reactive element of the LC filter preferably has at least part of its structure inside the wiring board; and mounting RF components other than the LC filter on the wiring board provides a more compact wiring board.

In the present embodiment, circuit elements are built into a wiring board. This configuration allows other components to be mounted on regions of the wiring board surface located above the built-in circuit elements, thereby providing a compact and high-performance wiring board.

Next, examples of a capacitor and an inductor as circuit elements of an LC circuit will be described taking an example of a substrate in which a wiring layer and an insulating resin layer are formed on each of opposite major surfaces of a core material made of a glass plate.

The capacitor has a structure such that a dielectric is interposed between two conductor plates. An example of the capacitor is shown in FIG. 1, in which an insulating resin layer 11 formed directly above or on a glass substrate (not shown) is laminated with a lower electrode 12 to form a conductor pattern, and this conductor pattern is further laminated with a dielectric layer 13 and an upper electrode 14 made of a conductor in this order. The lower electrode 12 and the upper electrode 14 may each be formed of a seed layer and a conductive layer to have a multi-layer structure.

Figure 2:
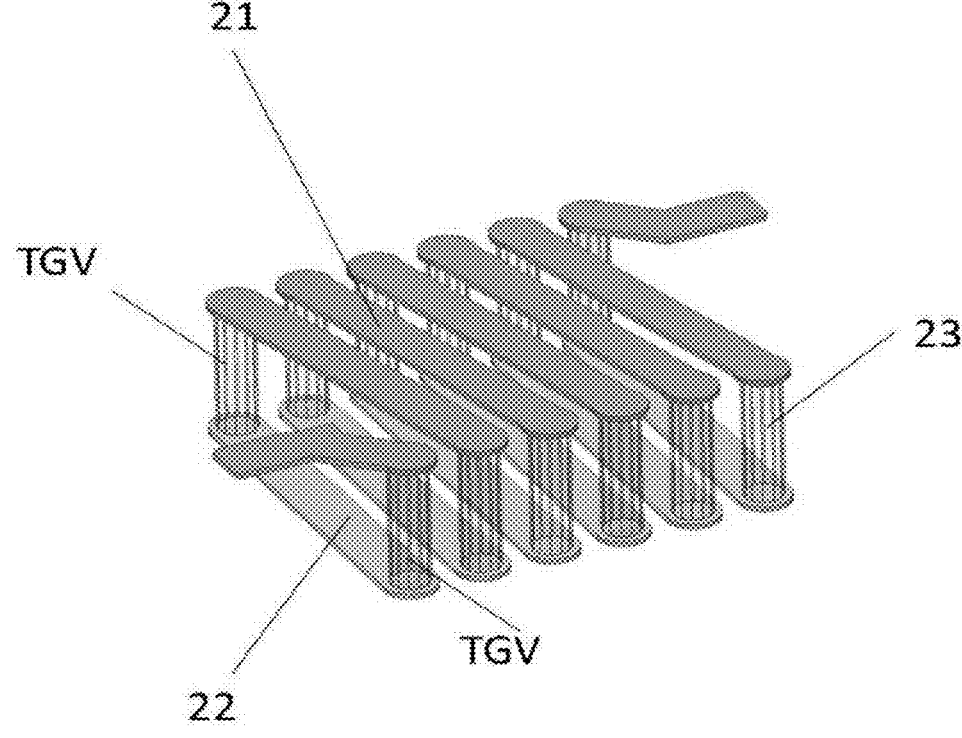
FIG. 2 is a perspective view of an inductor in the present embodiment.

As for the inductor, the same capability as that of a spiral coil can be built into a substrate having through holes. In FIG. 2, a flat glass plate having parallel surfaces and through holes arranged in two rows is shown transparent. As shown in FIG. 2, wirings 21 and 22 are formed to connect the openings of the adjacent through holes on the front and rear surfaces of the glass plate, while forming a conductor layer as a TGV on an inner wall of each through hole 23 that penetrates the glass plate between the front and rear surfaces.

Figure 3:
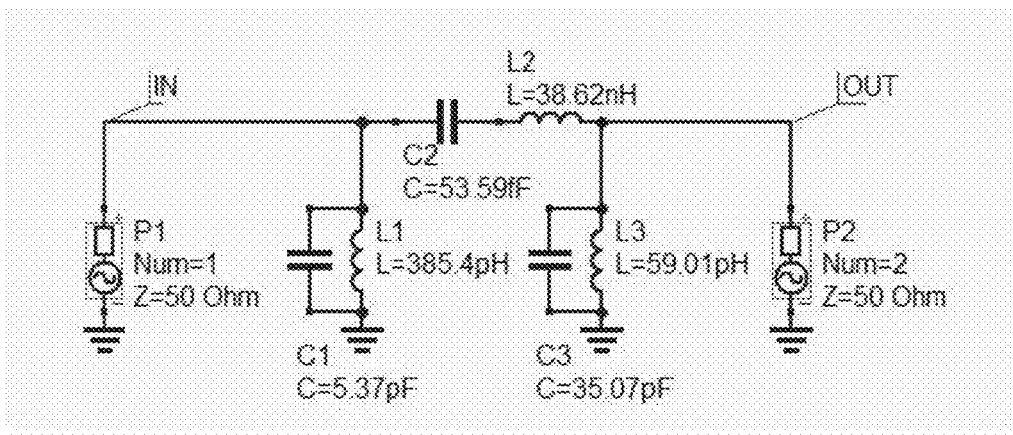
FIG. 3 is a circuit diagram of a bandpass filter in the present embodiment.

Next, description will be provided of a bandpass filter (BPF) formed of an LC circuit disposed inside the wiring board. FIG. 3 is a basic circuit diagram of the BPF. The electrical capacitance (hereafter "capacitance") of capacitors and the induction coefficient (hereafter "inductance") of inductors in the circuit can be appropriately set to achieve a bandpass effect that passes frequencies in a desired range and blocks others.

Figure 4:
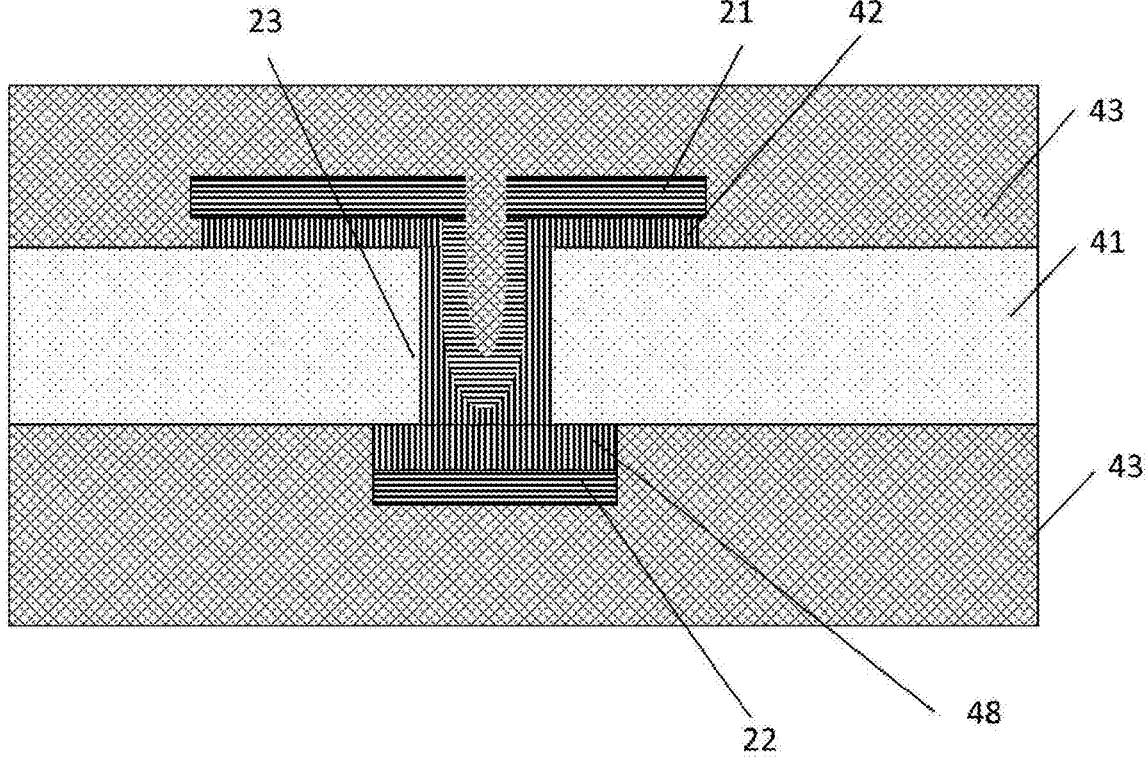
FIG. 4 is a partial cross-sectional view of a wiring board having a bandpass filter in the present embodiment.

FIG. 4 is a schematic diagram illustrating a state in which the capacitor and inductor shown in the circuit diagram of FIG. 3 are disposed in the wiring board. The capacitors C1 to C3 are entirely embedded in an insulating resin layer 43 disposed on the upper surface of the glass core 41, and can be connected to electrodes outside the wiring board by forming via holes in the insulating resin layer 43 to thereby allow the capacitors to be connected to the electrodes via a conductor inside each via hole.

As shown in FIG. 4, the inductors L1 to L3 can form a solenoid coil by connecting the TGVs formed in the through holes 23 of the glass core 41 and the wirings 21 and 22 disposed on the front and rear surfaces of the glass core 41. In FIG. 4, the reference characters 42 and 48 each represent an adhesion layer, which will be described in detail later. The bodies of the inductors L1 to L3 are embedded in the glass core 41 and the insulating resin layers 43 on the front and rear surfaces of the glass core 41, and can be electrically connected to electrodes on the outermost layers of the wiring board via their respective via holes provided in the insulating resin layers 43 as with the capacitors C1 to C3. The inductor L2 is a reactive element used in a circuit for suppressing interference between bandpass filters.

Example of Wiring Board

Figure 5:
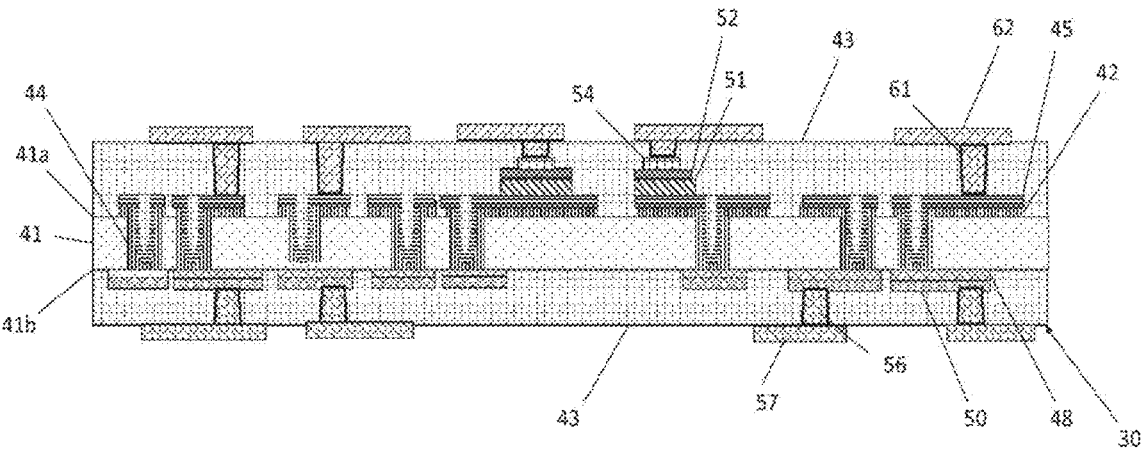
FIG. 5 is a cross-sectional view of an example wiring board according to the present embodiment.

FIG. 5 is a cross-sectional view of an example wiring board according to the present embodiment.

The wiring board 30 of the present embodiment includes a glass core member (also referred to as glass core) 41, a first adhesion layer 42, a second adhesion layer 48, a first wiring layer 45, and a second wiring layer 50. The glass core 41 has a first surface 41a, a second surface 41b opposite the first surface 41a, and through holes 44 penetrating the glass core 41 between the first surface 41a and the second surface 41b, each of the through holes 44 having a first end adjacent the first surface 41a, a second end adjacent the second surface 41b, and a bottom portion at the second end. The first adhesion layer 42 is in close contact with the first surface 41a and the inner walls of the through holes 44 and has portions each closing the bottom portion of a respective one of the through holes 44. The second adhesion layer 48 is in close contact with the second surface 41b and the portions of the first adhesion layer 42. The first wiring layer 45 and the second wiring layer 50 are disposed on the first adhesion layer 42 and the second adhesion layer 48, respectively.

The first wiring layer 45 and second wiring layer 50 each have an insulating resin layer 43 disposed thereon, with another wiring layer formed on the insulating resin layer 43.

The first wiring layer 45 has a dielectric layer 51, a seed layer 52, and an upper electrode 54 formed thereon as will be described later; these components together form a capacitor as shown in FIG. 1. Further, the first wiring layer 45, a conductor layer inside a through via 61 passing through the insulating resin layer 43, and a wiring pattern 62 together form an inductor as shown in FIG. 2. Although no description will be provided, the capacitors and inductors may be formed on either of the first wiring layer 45 side and the second wiring layer 50 side.

Figure 6:
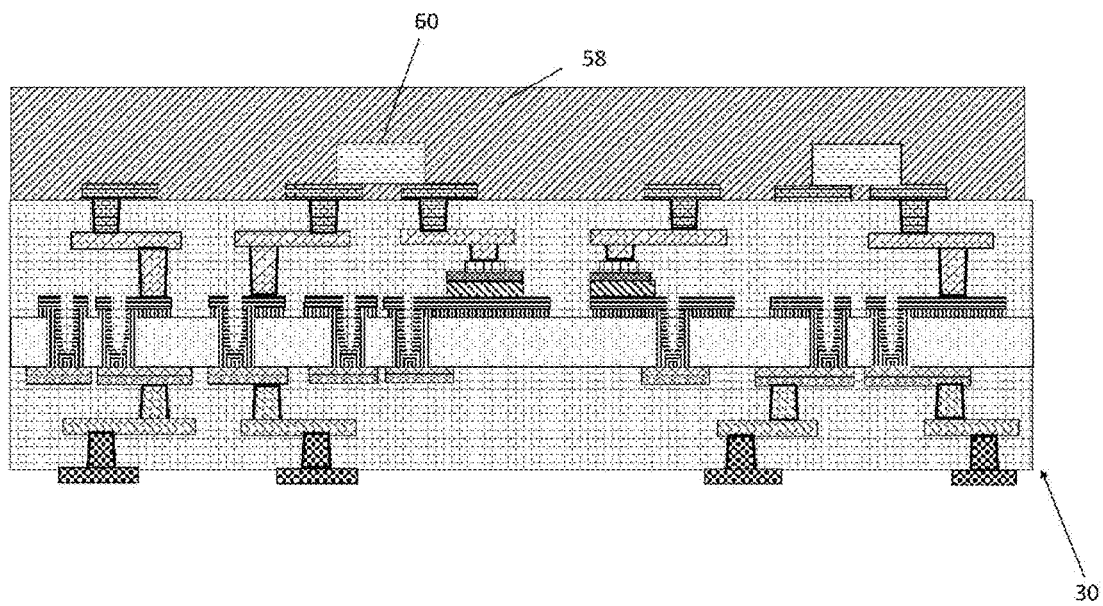
FIG. 6 is a cross sectional view of another example wiring board according to the present embodiment.

FIG. 6 is a cross-sectional view of another example of the wiring board 30 according to the present embodiment. As shown in FIG. 6, conductive components on one surface of the glass core 41 may be connected to high-frequency components 60 mounted on the wiring board 30, followed by molding with a mold resin 58, to thereby provide a module board. In this process, conductive components on the other surface of the glass core 41 may be connected to a motherboard (not shown).

<Board Fabrication Process>

With reference to FIGS. 7 to 21, an example process for fabricating a wiring board using a glass substrate will now be described.

[Circuit Design]

First, in order to design a circuit, required capacitance and inductance depending on the frequency bands of the radio waves intended to be passed or blocked are calculated using simulation software. Tables 1 and 2 show the specifications of elements for achieving desired characteristics in the circuit configuration shown in FIG. 3 for the bands of 3400 MHz or higher and 3600 MHz or lower, for example. Here, because the inductors L1 and L3 have very small inductance, they do not need to be formed in a coil shape, and self-inductance of a single wire is sufficient for them; thus, the dimensions of each wire are shown in the table.

TABLE 1

|  | C1 | C2 | C3 |
| --- | --- | --- | --- |
| Capacitance | 5.37 pF | 53.59 pF | 35.07 pF |
| Dielectric | SiN | SiN | SiN |
| Relative permittivity | 6.3 | 6.3 | 6.3 |
| Dielectric thickness | 200 nm | 200 nm | 200 nm |
| Length of one side | 138.7 μm | 13.9 μm | 354.5 μm |

TABLE 2

|  | L1 | L2 | L3 |
| --- | --- | --- | --- |
| Inductance | 385.4 pH | 38.62 pH | 59.01 pH |
| Number of turns |  | 11 |  |
| Coil width |  | 1.6 mm |  |
| Coil length |  | 1.5 mm |  |
| Coil thickness |  | 0.3 mm |  |
| Wiring length | 1.33 mm |  | 0.2 mm |
| Wiring width | 0.1 mm |  | 0.1 mm |
| Wiring thickness | 15 μm |  | 15 μm |

The required capacitance and inductance of the BPFs used for the bands of 2499 MHz or higher and 2690 MHz or lower are also calculated using the same procedure as above to design a required circuit (values are omitted).

[Joining of Glass Core and Support Member, and Formation of Seed Layer in Via]

A required wiring board is fabricated based on the circuit design described above. First, a low expansion glass core 41 (Thickness: 300 μm, CTE: 3.5 ppm/K) is prepared. Then, through holes 44 having an opening diameter of 80 μm to 100 μm are formed in the glass core 41. In the first step of formation of the through holes 44, positions on the glass core 41 desired for the through holes 44 to be formed at are pulse-irradiated with a UV laser beam to form weakened portions in the glass. In the second step, the entire glass plate is etched using an aqueous hydrofluoric acid solution.

Thus, the weakened portions are selectively etched, and highly accurate through holes 44 are quickly formed. In comparison with the case where a glass epoxy substrate is used, through holes 44 having a more accurate inner diameter and an inner peripheral surface with no unevenness can be formed.

Then, a support member 47 with an adhesive layer 46 is bonded to the glass core 41. The support member 47 is a substrate made of a material, for example, having light transmission properties (transparency). The support member 47 may transmit light with a wavelength, for example, in a range of 300 nm or more and 2000 nm or less, or more preferably in a range of 300 nm or more and 1100 nm or less. The support member 47 may have properties that transmit light with a specific wavelength, for example, a laser beam.

The support member 47 is preferably, for example, a glass substrate. Examples of the glass include a quartz glass, borosilicate glass, non-alkali glass, soda glass, sapphire glass, and the like. Setting the maximum roughness Rz of the major surface 47a of the support member to 0.01 μm or more suppresses the cost of the support member 47. Setting the maximum roughness Rz of the major surface 47a of the support member 47 to 5 μm or less suppresses disconnection, short circuit, and the like of the first wiring layer 45 due to unevenness of the major surface 47a.

The adhesive layer 46 includes a release layer and a protective layer, and serves to adhere the support member 47 and the glass core 41 to each other. The release layer is provided on the major surface of the support member 47 and contains a resin that can be decomposed by light irradiation. If laser light, for example, is used to release the release layer, the resin contained in the release layer is a resin that can be thermally decomposed by irradiation of laser light having a predetermined wavelength.

The resin contained in the release layer may be, for example, one of an epoxy resin, polyurethane resin, silicone resin, polyester resin, oxetane resin, and maleimide resin, or a mixture of two or more thereof. The adhesive layer 46 may have a thickness of, for example, 20 μm or more and 100 μm or less.

[Formation of First Adhesion Layer and First Wiring Layer]

Figure 7:
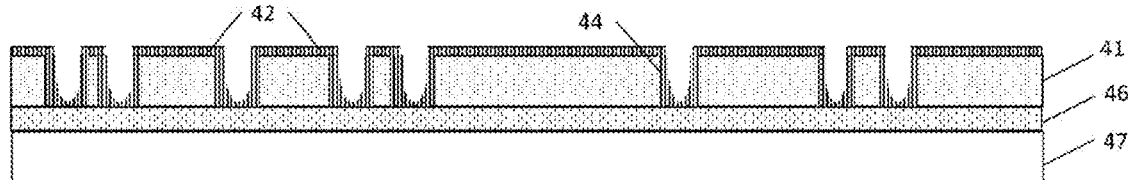
FIG. 7 is a diagram illustrating a step performed in producing a wiring board according to the present embodiment.

Further, a Ti film and a Cu film are formed in this order by sputtering on the entire front surface of the glass core 41 as a laminate of two layers constituting part of a first adhesion layer 42 (seed layer) under the wiring layer and on the inner walls of the through holes of the glass core 41 so that the glass front surface has electrical conductivity; thus, a structure of FIG. 7 is obtained.

Since the openings of the through holes 44 on the lower surface side are covered with the support member 47, the above sputtering results in formation of an adhesion layer (part of the first adhesion layer 42) on the first surface 41a of the glass core 41, the inner walls of the through holes 44 therein, and the support member 47, which blocks the openings of the through holes 44 on the lower surface side. The thicknesses of the Ti film and the Cu film are set to 50 nm and 300 nm, respectively. As a sputtering target, Ni, Cr, or the like may also be used. The sputtering target is desirably selected taking into consideration the adhesion to the substrate, membrane stress, process resistance, reliability, and the like.

Next, electroless nickel plating is applied to complement thin portions of the sputtered films on the inner walls of the through holes 44 and adjust the board warpage, thus providing an adhesion layer (remainder of the first adhesion layer 42) composed of Ti/Cu/Ni. The plating is applied to the entire front and rear surfaces of the glass core 41 and the insides of the through holes 44 therein, with the plating thickness set to 0.2 μm. Thus, the first adhesion layer 42 is formed.

Figure 8:
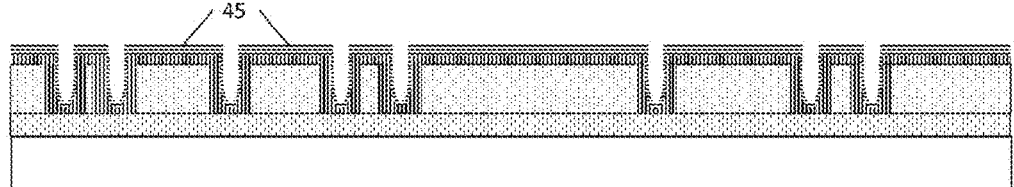
FIG. 8 is a diagram illustrating another step performed in producing the wiring board according to the present embodiment.
Figure 9:
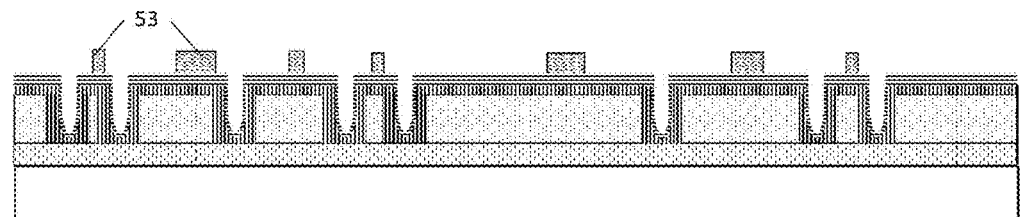
FIG. 9 is a diagram illustrating another step performed in producing the wiring board according to the present embodiment.

As shown in FIG. 8, a first wiring layer 45 for wirings of the inductors, lower electrodes of the capacitors, pads for external connection, and the like is formed by a semi-additive process using the first adhesion layer 42 as a seed layer. To form a conductor pattern in the first wiring layer 45, as shown in FIG. 9, a product RY-3525 (25 μm in thickness) produced by Hitachi Chemical Co., Ltd., for example, is laminated over the upper surface of the glass core 41, and a dry film resist layer 53 is formed thereof.

The dry film resist layer 53 may be formed by applying a liquid resist. Subsequently, photolithography is used to expose the dry film resist layer 53 to light via a mask for forming a conductor pattern, that is, a wiring pattern, and develop the dry film resist layer 53 to thereby form a wiring pattern (openings) in the resist layer.

Next, copper is deposited in the openings by electrolytic copper plating to form a first wiring layer 45 as a conductive member at a thickness of 15 μm. In this step, copper plating is also deposited on the inner walls of the through holes 44 of the glass core 41 and constitutes part of the first wiring layer 45.

Figure 10:
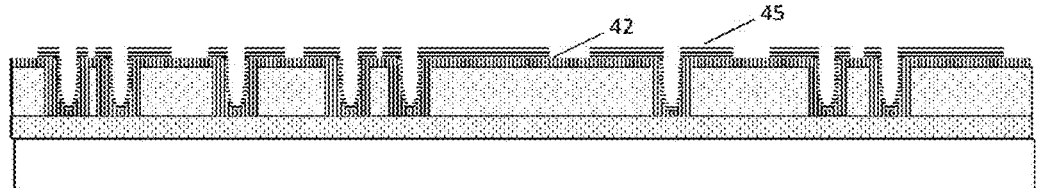
FIG. 10 is a diagram illustrating another step performed in producing the wiring board according to the present embodiment.

Subsequently, the dry film resist is removed. At this stage, as shown in FIG. 10, the surface of the glass core 41 has parts covered with the first adhesion layer 42, which is composed of Ti layer/Cu layer/Ni layer, and other parts covered with the first adhesion layer 42 and the first wiring layer 45, which is a Cu layer, laminated thereon. In the step of FIG. 10, a lower electrode of each capacitor is formed at a predetermined position on the conductor pattern.

Forming a seed layer using materials different from Cu used for a main conductive layer, that is, forming a layer comprising a Ti layer and an Ni layer in the above case, as described above, facilitates adjustment of stress exerted on the glass core 41 and thus board warpage. Further, forming dummy wirings including Cu at a desired position during formation of the dry film resist allows finer adjustment of board warpage.

Figure 11:
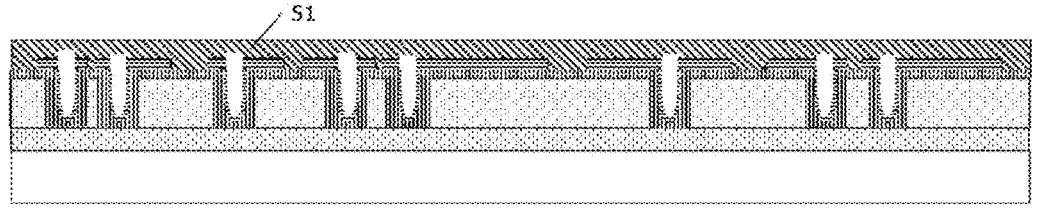
FIG. 11 is a diagram illustrating another step performed in producing the wiring board according to the present embodiment.
Figure 12:
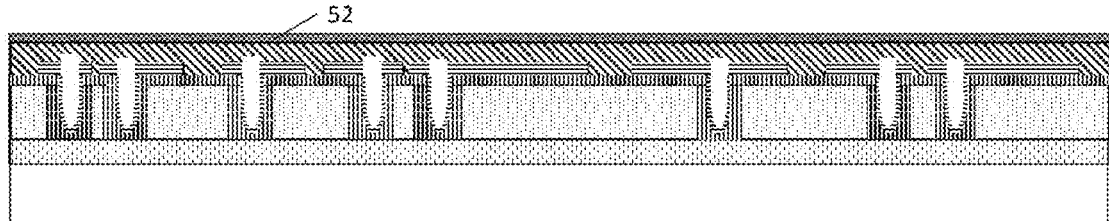
FIG. 12 is a diagram illustrating another step performed in producing the wiring board according to the present embodiment.

As shown in FIG. 11, first, a dielectric layer 51 of the capacitors is formed by forming a SiN film at a thickness of 200 nm to 400 nm over the entire surface of the glass core on the side where capacitors are to be formed, using a CVD method.

Further, as shown in 12, a Ti film and a Cu film are formed in this order on the entire surface of the dielectric layer 51 by sputtering at a thickness of 50 nm and 300 nm, respectively, to provide a seed layer 52 for formation of the upper electrode of the capacitors.

Figure 13:
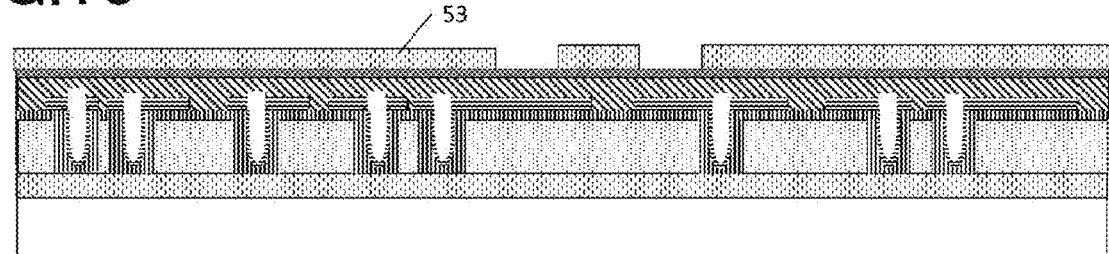
FIG. 13 is a diagram illustrating another step performed in producing the wiring board according to the present embodiment.
Figure 14:
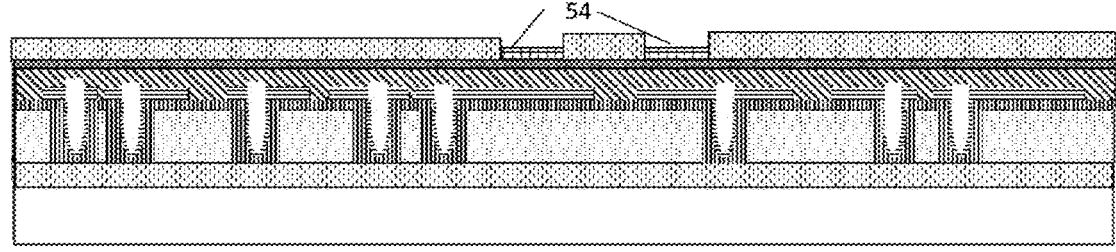
FIG. 14 is a diagram illustrating another step performed in producing the wiring board according to the present embodiment.

Subsequently, as shown in FIG. 13, only portions of the seed layer 52 where the upper electrode of the capacitors is to be formed are exposed from the dry film resist layer 53 by photolithography in order to form an upper electrode of the capacitors. Then, as shown in FIG. 14, electrolytic copper plating is applied to form an upper electrode 54 having a thickness of 9 to 10 μm. After that, the dry film resist layer 53 is removed. At this point, a SiN layer and the like are laminated in addition to the capacitors.

Accordingly, in order to remove excess adhesion layer, a plating seed layer, and the like, only the upper electrode 54 of the capacitors is first protected by a dry film resist (not shown) using photolithography.

Then, the board is processed by wet etching to remove excess portions of the sputtered copper layer formed in formation of the upper electrode 54 of the capacitors, and the board is processed by dry etching to remove the Ti layer and SiN layer in the excess portions.

More specifically, the uppermost sputtered Cu layer in the excess portions is removed with an etching solution. Then, the sputtered Ti layer and SiN layer formed by CVD which were located this Cu layer are removed by dry etching. Subsequently, the dry film resist protecting the upper electrode 54 of the capacitors is stripped off.

Then, in order to remove the seed layer for the conductive layer disposed over the front surface of the glass core 41, that is, the seed layer for the lower electrode of the capacitors and others, an Ni layer and a Ti layer are processed in this order by wet etching. As a result, the underlying sputtered Cu layer is also simultaneously removed. The Cu layer forming the wirings, capacitor electrodes, and the like is not completely removed because it is dissolved in the etching solution to some extent but has a relatively large thickness. Then, the sputtered Ti layer is removed by etching.

Figure 15:
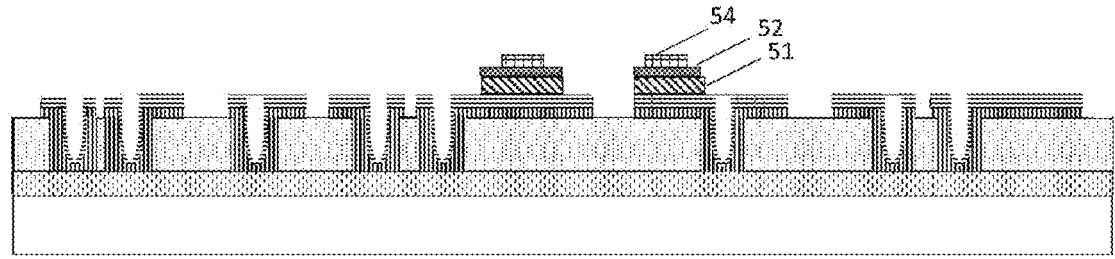
FIG. 15 is a diagram illustrating another step performed in producing the wiring board according to the present embodiment.

FIG. 15 shows the structure after the steps performed so far. At this stage, the glass core 41 is exposed in portions where the wirings, electrodes, dummy patterns, and the like are not disposed. As a result of the above, the front surface of the glass core 41 has formed thereon capacitors (refer to FIG. 1) composed of the first wiring layer 45, dielectric layer 51, seed layer 52, and upper electrode 54. Further, a portion of the continuous wiring constituting the inductor may be formed and connected to the conductor layer TGV.

Next, an insulating resin, for example, manufactured by Ajinomoto Fine-Techno Co., Inc. (product name "ABF-GX-T31R") is attached to the upper surface of the glass core 41 to form an insulating resin layer (resin build-up layer) 43. The processing involves using a vacuum press lamination machine to fill the through holes 44 of the glass core 41 with an insulating resin without voids. The thickness of the insulating resin layer 43 is set to approximately 35 μm so that the upper electrode 54 of the capacitors is completely buried therein.

[Separation of Support Member]

Figure 16:
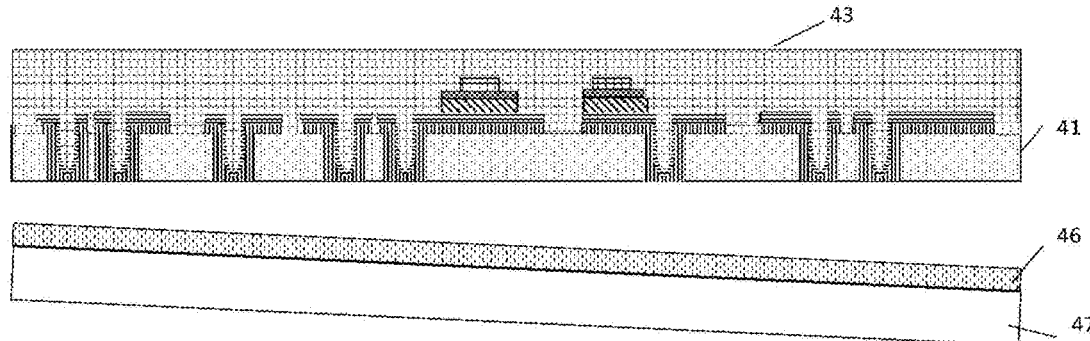
FIG. 16 is a diagram illustrating another step performed in producing the wiring board according to the present embodiment.

Then, as shown in FIG. 16, a laser beam L is applied to the adhesive layer 46 via the support member 47 to separate the support member 47. The laser beam L may be applied to the entire support member 47 or may be applied to desired positions on the support member 47. In production of the wiring board, the laser beam L is applied to the entire support member 47 in a linearly reciprocating manner in order to ensure decomposition of the resin in the adhesive layer 46.

The laser beam L may have a wavelength, for example, in a range of 300 nm or more and 2000 nm or less, preferably 300 nm or more and 1500 nm or less, and more preferably nm or more and 1100 nm or less. Examples of the apparatus that emits the laser beam L include a YAG laser system that emits light at a wavelength of 1064 nm, a second-harmonic generation YAG laser system with a wavelength of 532 nm, and a semiconductor laser system that emits light having a wavelength of 780 nm or more and 1300 nm or less.

The support member 47 has transparency, and transmits the laser beam L. Accordingly, the energy of the laser beam L transmitted through the support member 47 is absorbed by the adhesive layer 46. The absorbed energy of the laser beam L is converted into thermal energy in the adhesive layer 46. This thermal energy causes the resin of the adhesive layer 46 to reach a thermal decomposition temperature and thermally decompose. This reduces the force of the adhesive layer 46 adhering the support member 47 and the glass core 41 to each other.

[Formation of Second Adhesion Layer and Second Wiring Layer]

Figure 17:
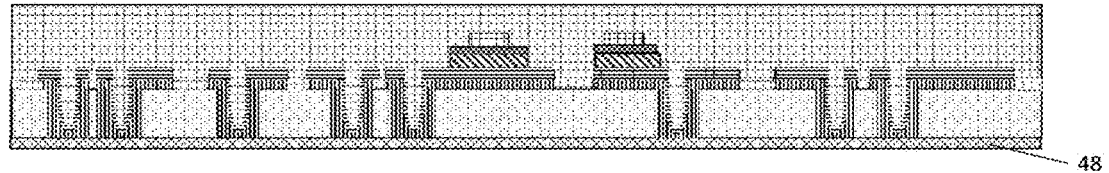
FIG. 17 is a diagram illustrating another step performed in producing the wiring board according to the present embodiment.

Next, as shown in FIG. 17, a Ti film and a Cu film are formed in this order by sputtering on the lower surface of the glass core 41 and the bottom portions of the through holes as a laminate of two layers constituting a second adhesion layer 48 so that the glass lower surface has electrical conductivity. The thicknesses of the Ti film and the Cu film are set to 50 nm and 300 nm, respectively.

Figure 18:
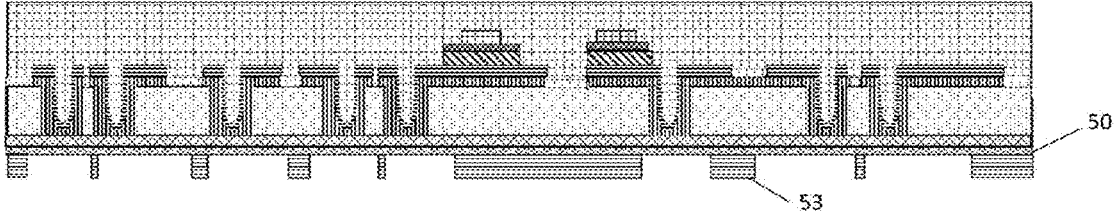
FIG. 18 is a diagram illustrating another step performed in producing the wiring board according to the present embodiment.

As shown in FIG. 18, a second wiring layer 50 for wirings of the inductors, lower electrodes of the capacitors, pads for external connection, and the like is formed by a semi-additive process using the second adhesion layer 48 as a seed layer. To form a conductor pattern in the second wiring layer 50, a product RY-3525 (25 μm in thickness) produced by Hitachi Chemical Co., Ltd., for example, is laminated over the lower surface of the glass core 41, and a dry film resist layer 53 is formed thereof.

The dry film resist layer 53 may be formed by applying a liquid resist. Subsequently, photolithography is used to expose the dry film resist layer 53 to light via a mask for forming a conductor pattern, that is, a wiring pattern, and develop the dry film resist layer 53 to thereby form a wiring pattern (openings) in the dry film resist layer 53.

Figure 19:
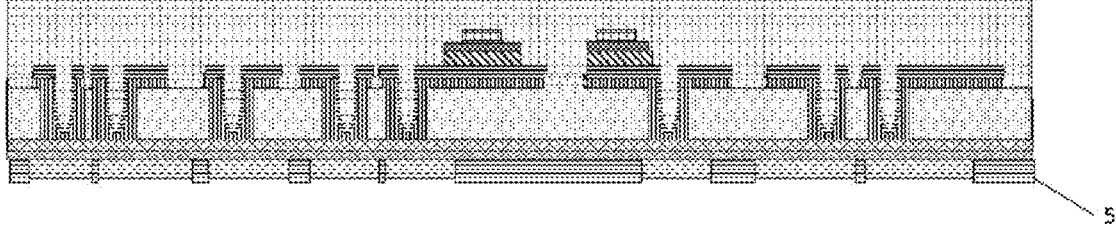
FIG. 19 is a diagram illustrating another step performed in producing the wiring board according to the present embodiment.

Next, as shown in FIG. 19, copper is deposited in the openings by electrolytic copper plating to form a second wiring layer 50 as a conductive member at a thickness of 15 μm. In this step, copper plating is also deposited over the bottom portions (closed by the first adhesion layer 42) of the through holes 44 of the glass core 41.

Figure 20:
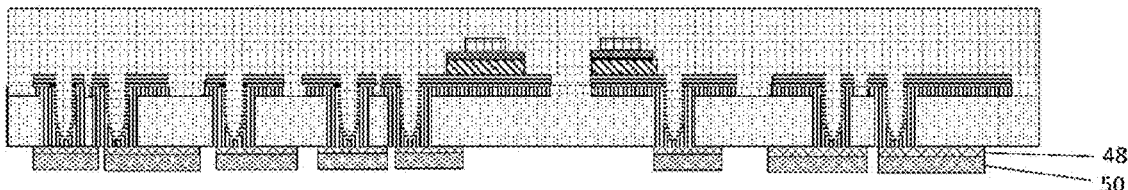
FIG. 20 is a diagram illustrating another step performed in producing the wiring board according to the present embodiment.

Then, as shown in FIG. 20, the board is processed by wet etching to remove excess wiring portions, and the board is processed by dry etching to remove the Ti layer in the excess portions.

More specifically, the uppermost sputtered Cu layer in the excess portions is removed with an etching solution. Then, the sputtered Ti layer located this Cu layer is removed by dry etching. Subsequently, the dry film resist layer 53 protecting the second wiring layer 50 is stripped off.

Figure 21:
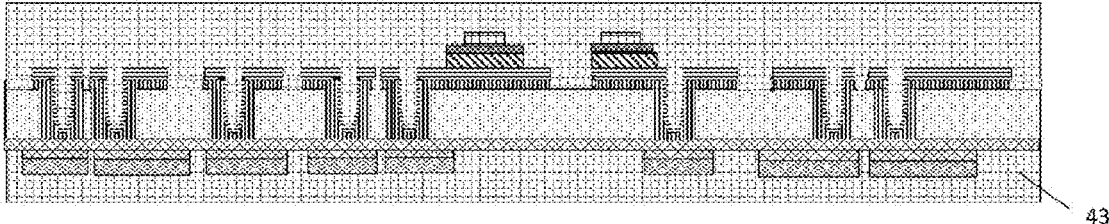
FIG. 21 is a diagram illustrating another step performed in producing the wiring board according to the present embodiment.

Next, as shown in FIG. 21, an insulating resin, for example, manufactured by Ajinomoto Fine-Techno Co., Inc. (product name "ABF-GX-T31R") is attached to the lower surface of the glass core 41 to form an insulating resin layer (resin build-up layer) 43. The processing involves using a vacuum press lamination machine to seal the wiring pattern of the second wiring layer 50 with an insulating resin without voids. The thickness of the insulating resin layer 43 is set to approximately 35 μm so that the wiring pattern of the second wiring layer is completely buried therein.

Further, the insulating resin layer 43 is penetrated by laser processing at positions where electrical connection is desired to thereby form through holes 56 that reach the wiring layer of the glass core as shown in FIG. 5. The through holes 56 preferably have a diameter of approximately 60 μm.

Although not shown, the insulating resin layers 43 on the front and rear surfaces of the glass core 41 are processed with an alkaline-based surface roughening solution to thereby adjust the arithmetic surface roughness Ra to 60 nm. The purpose of this processing is to increase the adhesion of the seed layers in the next step.

Next, the insulating resin layers 43 on the front and rear surfaces of the glass core are subjected to electroless copper plating to have a conductive seed layer 57 formed thereon.

The conductive seed layer 57 preferably has a thickness of 0.6 μm. With this processing, the conductive seed layer 57 is formed not only on the front and rear surfaces but also on the inner walls of the holes that have been previously formed by laser processing.

Although not shown, a dry film resist DR is attached to each of the front and rear surfaces of the board, and openings are formed by photolithography in portions of each resist where wirings are to be provided. Then, electrolytic plating is applied to the board to form wirings having a thickness of 15 μm. With this electrolytic plating, the through holes 56 in the insulating resin layer 43 are filled with copper and thus are electrically connected to the second conductor layer 50 on the surface of the glass core 41.

Then, unnecessary portions of the conductive seed layer are removed by etching. Thus, a basic wiring board 30 including the built-in elements for the LC circuit is completed as shown in FIG. 5. In the figure, the built-up wirings on the lower side of the glass core 41 are shown as if they have a copper layer that serves as a ground for the capacitors and inductors incorporated in the wiring board. However, this is not necessarily required for an actual wiring board as long as predetermined capacitors and inductors are grounded when the wiring board is completed.

Then, if necessary, the above steps may be repeated to laminate the insulating resin layer and conductor wiring layer, followed by mounting of electronic components. Further, a reactive element (coil) having a flat shape (e.g., spiral shape) can be formed on the surface of the glass core 41 or the insulating resin layer 43. Further, an electrically neutral through hole can be provided between the reactive elements to reduce losses due to mutual induction, or a capacitor can be provided in the through holes.

Here, a proportion of copper remaining in the first wiring layer 45 is represented by C=B/A (%), where A is a total area of the first wiring layer 45;

B is an area of copper in the first wiring layer 45; and

C is a remaining copper ratio C defined as the proportion of copper remaining in the first wiring layer 45.

Here, the remaining copper ratio C is 70 to 100%. Note that, if the first wiring layer 45 has dummy wirings, the remaining copper ratio C is often 75 to 85% in light of the dummy wirings. The remaining copper ratio C is the predominant cause of effects exerted by the first wiring layer 45 on warpage of the wiring board 30 having a relatively thin glass core.

In actual wiring board design, the factor affecting the board warpage the most is the remaining copper ratio. Accordingly, to avoid a difference between the remaining copper ratios at the front and rear surfaces of the board as much as possible, dummy patterns and/or the like are formed so as to, for example, adjust a difference between the remaining copper ratios at the front and rear surfaces of the board to be within 10%. If this adjustment is accomplished as designed, the board will not have much warpage. However, if the board warpage is desired to be further suppressed, the present embodiment may be applied to make fine adjustments of warpage.

As an example of such adjustments, Young's moduli (Ti=106 GPa, Ni=199.5 GPa) of materials of the first adhesion layer 42 may be set to values lower than the Young's modulus (Cu=129.8 GPa) of a material of the first wiring layer 45, to allow the first adhesion layer 42 to have greater rigidity than the first wiring layer 45, thereby suppressing warpage of the wiring board 30. However, an excessively low Young's modulus of the first adhesion layer 42 poses a risk that the first adhesion layer 42 may suffer from cracking or the like due to becoming brittle.

To address this, in the present embodiment, Young's moduli of materials of the first adhesion layer 42 are set to values 0.1 to 0.85 times the Young's modulus of a material of the first wiring layer 45 Setting optimum Young's moduli in such a manner enables effective suppression of warpage of the wiring board 30. The second wiring layer 50 is also preferably adjusted in the same manner.

Further, adjusting the thicknesses of the first adhesion layer 42 and first wiring layer 45 and the ratio between these thicknesses allows finer adjustment of membrane stress exerted on the glass core 41, thus enabling adjustment of warpage of the wiring board 30.

In particular, when desired wiring patterns are formed on the front and rear sides of the glass core 41, patterns and thicknesses of respective layers are typically different, and these are factors in causing warpage. In the present embodiment, the first adhesion layer 42 and the first wiring layer 45 have different configurations that enable adjustment of total membrane stress exerted on the glass core 41 and thus adjustment of the board warpage. Specifically, the number of layers constituting the first adhesion layer 42, the thickness of respective layers constituting the first adhesion layer 42, and the like may be changed.

[Reference Signs List] 11: Insulating resin layer; 12: Lower electrode of capacitor; 13: Dielectric layer of capacitor; 14: Upper electrode of capacitor; 21, 22: Wiring; 23: Through hole; 30: Wiring board; 41: Glass core; 42: First adhesion layer; 43: Insulating resin layer; 44: Through hole; 45: First wiring layer; 46: Adhesive layer; 47: Support member; 48: Second adhesion layer; 50: Second wiring layer; 51: Dielectric layer; 52: Seed layer; 53: Dry film resist layer; 54: Upper electrode of capacitor; 56: Through hole; 57: Conductive seed layer; 58: Mold resin; 60: High-frequency component.

What is claimed is:

1. A wiring board, comprising:

a glass core member having:

a first major surface;

a second major surface opposite the first major surface; and through holes penetrating the glass core member between the first major surface and the second major surface, each of the through holes having a first end adjacent the first major surface, a second end adjacent the second major surface, and a bottom portion at the second end;

a first adhesion layer in close contact with the first major surface and respective inner walls of the through holes, the first adhesion layer having portions each closing the bottom portion of a respective one of the through holes;

a second adhesion layer in close contact with the second major surface and the portions of the first adhesion layer;

a first wiring layer disposed on the first adhesion layer; and a second wiring layer disposed on the second adhesion layer, wherein a proportion of remaining copper on the first major surface is set to 70 to 100%, a proportion of remaining copper of the second major surface is within 10% of the proportion of remaining copper on the first major surface, the first adhesion layer is comprised of at least one material having a first predetermined Young's modulus, and the first wiring layer is comprised of at least one material having a second predetermined Young's modulus, the first predetermined Young's modulus being 0.1 to 0.85 times the second predetermined Young's modulus, wherein:

the first adhesion layer comprises a Ti film and a Cu film; and the first wiring layer comprises Cu.

2. The wiring board of claim 1, wherein:

part of the first adhesion layer and the first wiring layer are comprised of electroless plating.

3. The wiring board of claim 1, wherein:

the first wiring layer comprises one or more dummy wirings.

4. The wiring board of claim 1, wherein the first adhesion layer further comprises a Ni film.

\* \* \* \* \*